(12) United States Patent
Dietrich

(10) Patent No.: US 7,443,762 B2
(45) Date of Patent: Oct. 28, 2008

(54) SYNCHRONIZATION CIRCUIT FOR A WRITE OPERATION ON A SEMICONDUCTOR MEMORY

(75) Inventor: Stefan Dietrich, Türkenfeld (DE)

(73) Assignee: Qimonda AG, Munich (DE)

( * ) Notice: Subject to any disclaimer, the term of this patent is extended or adjusted under 35 U.S.C. 154(b) by 41 days.

(21) Appl. No.: 11/593,236

(22) Filed: Nov. 6, 2006

(65) Prior Publication Data

US 2007/0109907 A1   May 17, 2007

(30) Foreign Application Priority Data

Nov. 11, 2005   (DE) .................. 10 2005 053 916

(51) Int. Cl.
*G11C 8/00* (2006.01)
(52) U.S. Cl. .................. 365/233.1; 365/189.05; 365/221
(58) Field of Classification Search .......... 365/233, 365/189.05, 221
See application file for complete search history.

(56) References Cited

U.S. PATENT DOCUMENTS 5,594,927 A * 1/1997 Lee et al. ............... 710/66
6,337,809 B1   1/2002 Kim et al.

OTHER PUBLICATIONS

HYB18H512321AF-12/14/16/20 "512-Mbit GDDR3 Graphics RAM—RoHS Compliant—Memory Products," *Infineon Technologies* Data Sheet dated Aug. 2005.

* cited by examiner

*Primary Examiner*—Huan Hoang
(74) *Attorney, Agent, or Firm*—Patterson & Sheridan, L.L.P.

(57) ABSTRACT

A synchronization circuit for handling and synchronizing a write operation on a semiconductor memory, in which a write operation contains a plurality of write commands, comprises a controllable first FIFO and a controllable second FIFO. The first FIFIO is clocked by a WDQS signal and stores write data on the basis of one or more successive write commands. The second FIFO is clocked by an internal clock signal and stores, for a write operation, only addresses associated with valid write data of the write data stored in the first FIFO.

17 Claims, 9 Drawing Sheets

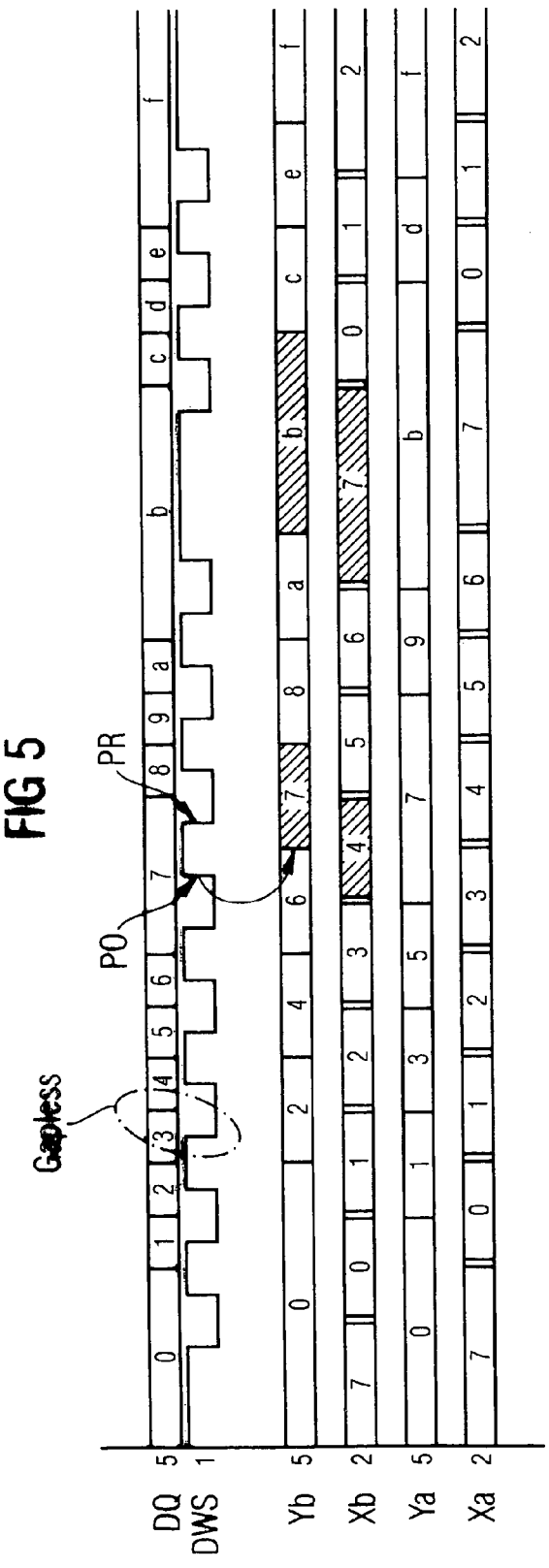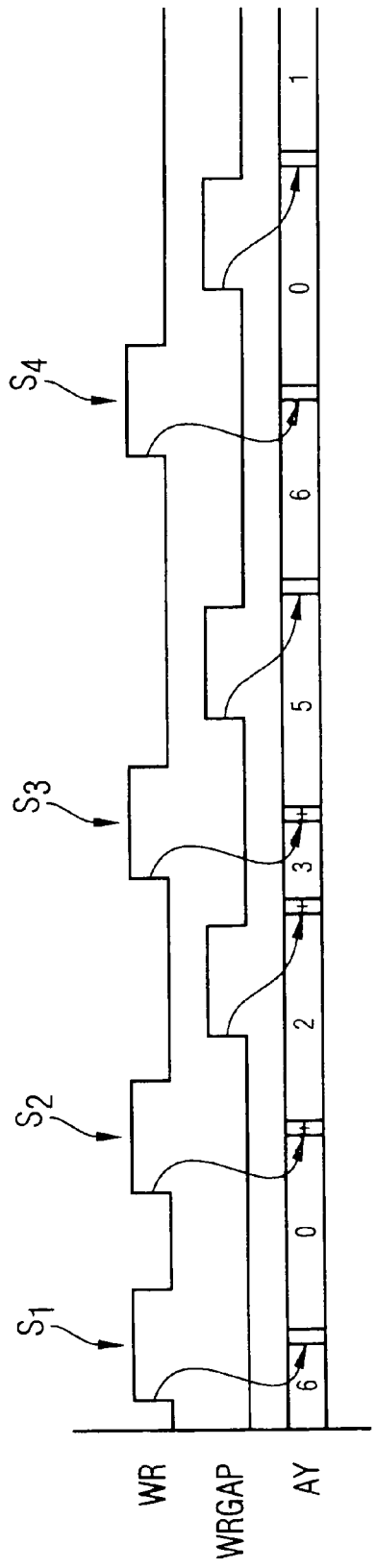

SYNCHRONIZATION CIRCUIT FOR A WRITE OPERATION ON A SEMICONDUCTOR MEMORY

BACKGROUND OF THE INVENTION

The invention relates to a synchronization circuit for handling and synchronizing a write operation on a semiconductor memory, particularly a DDR graphics memory.

In modern computer and software applications, there is increasingly the need to process ever greater volumes of data in ever shorter times. The data are stored using large-scale integrated memories, such as DRAM stores. In order to comply with the need for ever greater speed when processing data, the data need to be written to the memory and read from this memory again at corresponding speed. This can be implemented, by way of example, at an ever increasing operating frequency which can be used to read or write the data from or to a semiconductor memory.

Another option is to use semiconductor memories designed specifically for high data rates. One representative of such a semiconductor memory is what is known as the "DDR-DRAM" store, with DDR standing for "Double Data Rate". Although they may be applied to any semiconductor memories, the present invention and its underlying problems are explained below with reference to DDR-DRAM semiconductor memories and, in this case, particularly to graphics memories of this kind. Whereas, in conventional semiconductor memories, read and write operations are carried out only upon the rising or upon the falling edge of a clock signal, data in the case of the said DDR semiconductor memories are read from the semiconductor memory and written back to the memory both upon the rising edge and upon the falling edge of a clock signal. These semiconductor memories are therefore distinguished by a double data rate.

Future DDR graphics memories from the third generation (G-DDR-III) have improved performance. According to the G-DDR-III specification, it is now permissible to send series of write commands to the graphics memory, with at least one "NOP command" (NOP=No Operation) needing to be provided between two successive write commands WR. FIG. 1 shows a flow diagram for G-DDR-III write access in which, for a series of two write commands WR, first of all a first write command WR and then a second write command WR are executed. In this case, WL denotes the write latency.

In the case of a G-DDR-III memory, the burst length is stipulated as 4, that is to say that within a data burst lasting two clock cycles (WL=2) of the clock signal CLK there are four data packets D00-D03, D10-D13 processed in parallel. After the end of a respective write command WR, the counter is at CS="0" in each case. The write access is controlled by the clock signal CLK or by a control signal WDQS derived therefrom. This control signal WDQS is the data strobe write clock control signal WDQS, subsequently also called the write clock control signal WDQS or the WDQS signal WDQS for short. Upon a first falling edge of the WDQS signal WDQS, the counter is started. This edge of the WDQS signal WDQS is also called the preamble PR. Upon each subsequent rising or falling edge of the WDQS signal WDQS, a respective data packet D00-D03 from a first data burst DB1 is latched, that is to say is written to a buffer store. This means that for a counter reading of "4" the respective last data packet D03 from the first data burst DB1 is latched. The subsequent rising edge of the WDQS signal WDQS, which edge corresponds to the counter reading "5", is also called the postamble PO. Upon the postamble PO, the counter is reset from "5" to "0". The counter reading then remains at "0" until a second write command WR is used to signal further write access in order to latch data packets D10-D13 from a subsequent second data burst DB2.

One critical case for the counter arises in the event of write access in which there is respectively just a single NOP command (NOP=No Operation) between two successive write commands WR, that is to say for the command sequence WR, NOP, WR, NOP, etc. Such a sequence with just one NOP command NOP between two write commands WR is subsequently also called a "gapless" write command, since in this case the data from two successive data bursts are intended to be written to the graphics memory in the form of a continuous data stream. FIG. 2 shows a flow diagram to illustrate this critical case in the event of three successive gapless write commands. The problem here is that the respective last rising edge, that is to say the postamble PO, which is associated with the last data packet D03 from the data burst DB1, and the first falling edge, that is to say the preamble PR, which is associated with the first data packet D10 from the subsequent data burst DB2, overlap. This means that it is no longer possible to distinguish clearly between the data packets D00-D03, D10-D13 from two successive data bursts DB1, DB2.

The problem is revealed particularly in the case of the counter or its counter reading. On the basis of the counter reading, the counter would interpret the edge of the WDQS signal WDQS from the second data burst DB2 as a preamble PR in this case, even though the preamble PR from this data burst DB2 had actually already been present one clock cycle previously. Similarly, the counter output signal in the case of the third gapless write command, that is to say in the case of the third data burst DB3, would accordingly be two clock cycles too late. Particularly with a large number of such successive gapless write commands WR, the result is then inevitably an increasing shift in the counter output signal with the result that the individual data packets Dx0-Dx3 from the various data bursts DBx are no longer latched properly and hence can no longer be written to the memory properly.

Published German application for patent No. 10 2004 021 694 A1 describes a method for controlling write access and for handling such conflicts in the case of gapless write commands. This document provides a counter for counting the WDQS edges and also a logic circuit which identifies gapless write commands from the detected command sequences and sets a control signal (or control flag) which indicates the presence of a gapless write command. When the control flag is present, the counter is prompted to count two edges of the WDQS signal fewer than is the case for conventional, that is to say non-gapless, write commands (known as gapped write commands).

However, the problem with this is that this control flag is in sync with the on-chip clock CLK, and the WDQS signal is in sync with the write data DQ. Since the WDQS signal is therefore out of sync with the internal clock signal, there may be a fluctuation between the timing of the WDQS signal and that of the internal clock signal. According to the G-DDR-III specification, the phases of the WDQS signal and of the internal clock signal probably differ by up to half a clock cycle. At operating frequencies for the DRAM semiconductor memory extending into the MHz range, this can also be implemented more or less without difficulty. However, this requirement is a problem for operating frequencies in the high MHz range and from the GHz range onward, since here the difference between the phases of the WDQS signal and of the internal clock signal may become increasingly great. In addition, propagation time differences play an increasing role here.

BRIEF DESCRIPTION OF THE INVENTION

In one aspect of the invention, a synchronization circuit for handling and synchronizing a write operation on a semiconductor memory, particularly a DDR graphics memory, in which a write operation contains a plurality of write commands, comprises a controllable first FIFO, which is clocked by a WDQS signal and stores write data on the basis of one or more successive write commands, and a controllable second FIFO which is clocked by an internal clock signal and which stores, for a write operation, the addresses only of the valid write data which are stored in the first FIFO.

The present invention uses two different FIFOs to distinguish between gapless write commands and conventional gapped write commands. The idea on which the present invention is based is for not only the first FIFO, which is used to store the write data, but now also an additional second FIFO to be provided which uses each write command to store the start address from which valid write data are stored in the first FIFO. The first FIFO thus acts as a data FIFO and the second FIFO acts as an address FIFO for the valid data stored in the first FIFO.

In this case, the write data arriving on the data lines are read into the first FIFO upon every valid edge of the WDQS write clock control signal, without taking account of whether or not they are valid write data. This reading-in of the write data thus takes place in sync with the timing of the WDQS write clock control signal and is therefore not dependent on other influences, for example on the timing of the internal clock signal or on the influence of connecting lines.

In addition, the second FIFO is provided, which stores the addresses of just the valid write data stored in the first FIFO. For this, an address counter is provided whose content is increased by a fixed value upon every write command, and a decoder is provided for distinguishing between a continuous and an interrupted flow of data.

If access is being effected with a continuous, that is to say uninterrupted, flow of data (what is known as a gapless write command) then the counter reading of the address counter is increased continuously by +2 upon every write command, that is to say upon every data burst. This value (+2) is derived from the length of two clock cycles, which correspond to a burst length of four in the case of the DDR standard. If, by contrast, access is being effected with an interrupted, that is to say discontinuous, flow of data (what is known as a gapped write command) then the preamble and postamble mean that the counter reading of the address counter is additionally increased by +1.

The invention now provides a decoder which identifies a gapped write command of this kind and, when a gapped write command has been identified, outputs an appropriate control signal, so that the address counter is additionally increased by +1. This means that the second FIFO contains the start addresses from which the first FIFO stores valid write data, regardless of whether the data have been read on the basis of a gapless write command or a gapped write command. When the first FIFO is read, the start address for each write command—that is to say both for a gapless write command and for a gapped write command—is read from the second FIFO, and the data are read from the first FIFO again starting from this start address.

The second FIFO is clocked by a clock signal from the memory, for example from the internal clock signal. Writing to the second FIFO therefore takes place entirely in the domain of the internal clock signal, that is to say is totally independent of the timing of the WDQS write clock control signal. The overall result of this is that the reading of the data into the first FIFO and the storage of the addresses corresponding to these data in the second FIFO are entirely independent of and decoupled from one another. It is not necessary for the first and second FIFOs or the WDQS write clock control signal to be synchronized to the internal clock signal in this case, since the first FIFO can actually be operated independently of the second FIFO.

The inventive method is distinguished by a very high performance level in the case of write access, since even the presence of gapless write commands does not require any delay to be incorporated and hence a high write speed is ensured for writing data to the semiconductor memory. Another advantage is particularly that it is possible for data to be written to a semiconductor memory, such as a DDR semiconductor memory, even at very high operating frequencies. In particular, it is now also possible to operate G-DDR-III semiconductor memories at operating frequencies of 1 GHz without data losses in the case of gapless write commands.

One embodiment of the inventive circuit provides a first control circuit clocked by the WDQS signal for controlling the first FIFO. This first control circuit is designed to use the WDQS signal to produce an input pointer indicating at what location—that is to say in which FIFO cells—in the first FIFO the write data need to be buffer-stored. To latch the write data, the first control circuit preferably has at least one latch or an appropriate buffer memory circuit. The write data are latched under the control of the WDQS signal or a signal derived therefrom, for example an inverse WDQS signal.

Another embodiment of the inventive circuit provides a first latch for latching the write data upon a falling edge of the WDQS signal and a second latch for latching the write data upon a rising edge of the WDQS signal, the latching respectively taking place alternately upon a falling and a rising edge of the WDQS signal. In this connection, it is also advantageous if the first FIFO is of two-part design and accordingly two counters are provided for producing a respective input pointer for a respective one of the two FIFO parts. Such an input pointer indicates the location at which the write data need to be written to the first FIFO. In the case of the two-part design of the first FIFO, a first half of the FIFO cells is provided for storing the write data latched upon a falling edge of the WDQS signal and a second half of the FIFO cells in the second FIFO is provided for storing the write data latched upon a rising edge of the WDQS signal. In this way, the data can be written to the semiconductor memory very much more quickly.

A second control circuit clocked by the internal clock signal may be provided for controlling the second FIFO. The second control circuit may use the internal clock signal and the write commands to produce an output pointer for actuating the first FIFO, when the output pointer indicates at what location in the first FIFO the valid write data are stored.

To this end, the second control circuit firstly comprises a decoder which uses the write command and the duration of at least two successive write commands to derive a control signal which indicates whether a continuous (gapless) or an interrupted (gapped) data stream is present on the basis of two successive write commands. Secondly, the second control circuit has an address counter whose counter reading is incremented by a first value upon each write command and is additionally incremented by a second value in the presence of two directly successive write commands. At the end of a respective write command—that is to say when a final value of the address counter is reached—the address counter's counter reading is reset to a start value. Typically, the first value is two and the second value is one.

In another embodiment of the inventive circuit, the address counter has its output connected to inputs of the second FIFO. In addition, the second control circuit has a second counter which, for each write command, produces an input pointer indicating the location in the second FIFO at which a start address produced from the counter reading of the address counter needs to be stored. Using a stored start address in the second FIFO, the latter's output provides an output pointer indicating the location in the first FIFO at which valid write data are stored.

When there are two not directly successive write commands, which result in an interrupted data stream, that is to say in the case of what are known as gapped write commands, the start (preamble) and the end (postamble) of the respective data burst have cells with an invalid content in the first FIFO. By contrast, when there are two directly successive write commands, which result in a continuous data stream, that is to say in the case of what are known as gapless write commands, only the start of the first data burst and the end of the last data burst have cells in the first FIFO with an invalid content. Especially the FIFO cells in the first FIFO, which are respectively associated with adjacent data bursts, contain valid write data, however.

The invention is primarily suitable for DDR semiconductor memories and particularly for appropriate graphics memories from the third generation (G-DDR-III). On the basis of the G-DDR-III specification, the WDQS signal has a firmly defined first logic level ("0" or LOW) in the inactive state. At the start of a write operation the WDQS signal changes from a firmly defined second logic level ("1" or HIGH) to the first logic level ("0"). According to the G-DDR-III specification, all signals are terminated to a logic high level ("1") and to 60 ohms. During operation, the "1" is 40 ohms.

BRIEF DESCRIPTION OF THE SEVERAL VIEWS OF THE DRAWINGS

The invention is explained in more detail below using the exemplary embodiments indicated in the schematic figures of the drawing, in which:

FIG. 5 is a signal timing diagram to show the signal profile of the data and clock signals in the circuit arrangement from FIG. 4.

FIG. 7 is a signal timing diagram to show the signal profile of the signals in the circuit arrangement from FIG. 6.

DETAILED DESCRIPTION OF THE INVENTION

Figure 1:
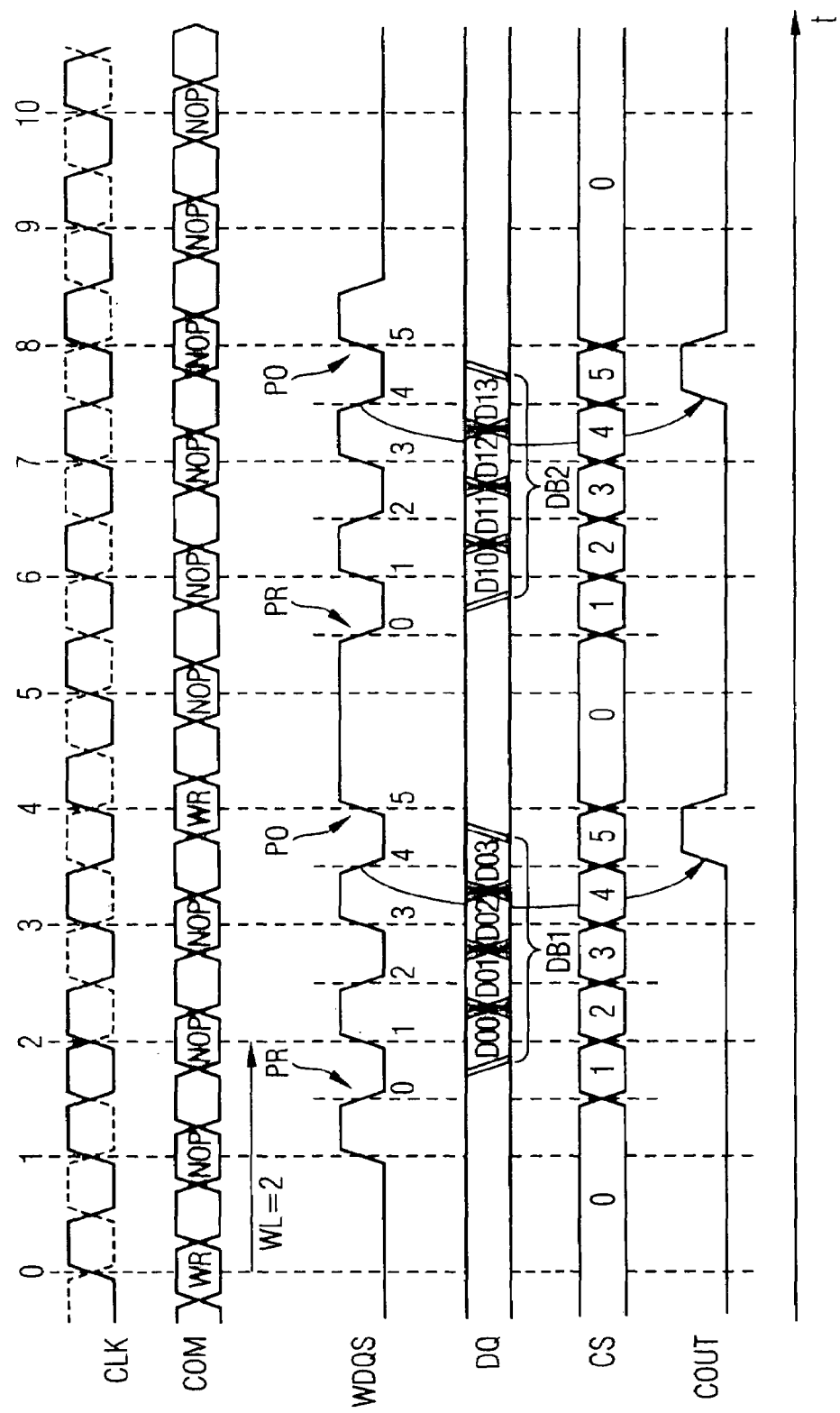
FIG. 1, as discussed above, is a flow diagram to illustrate an interrupted data stream in the case of a series of write commands.
Figure 2:
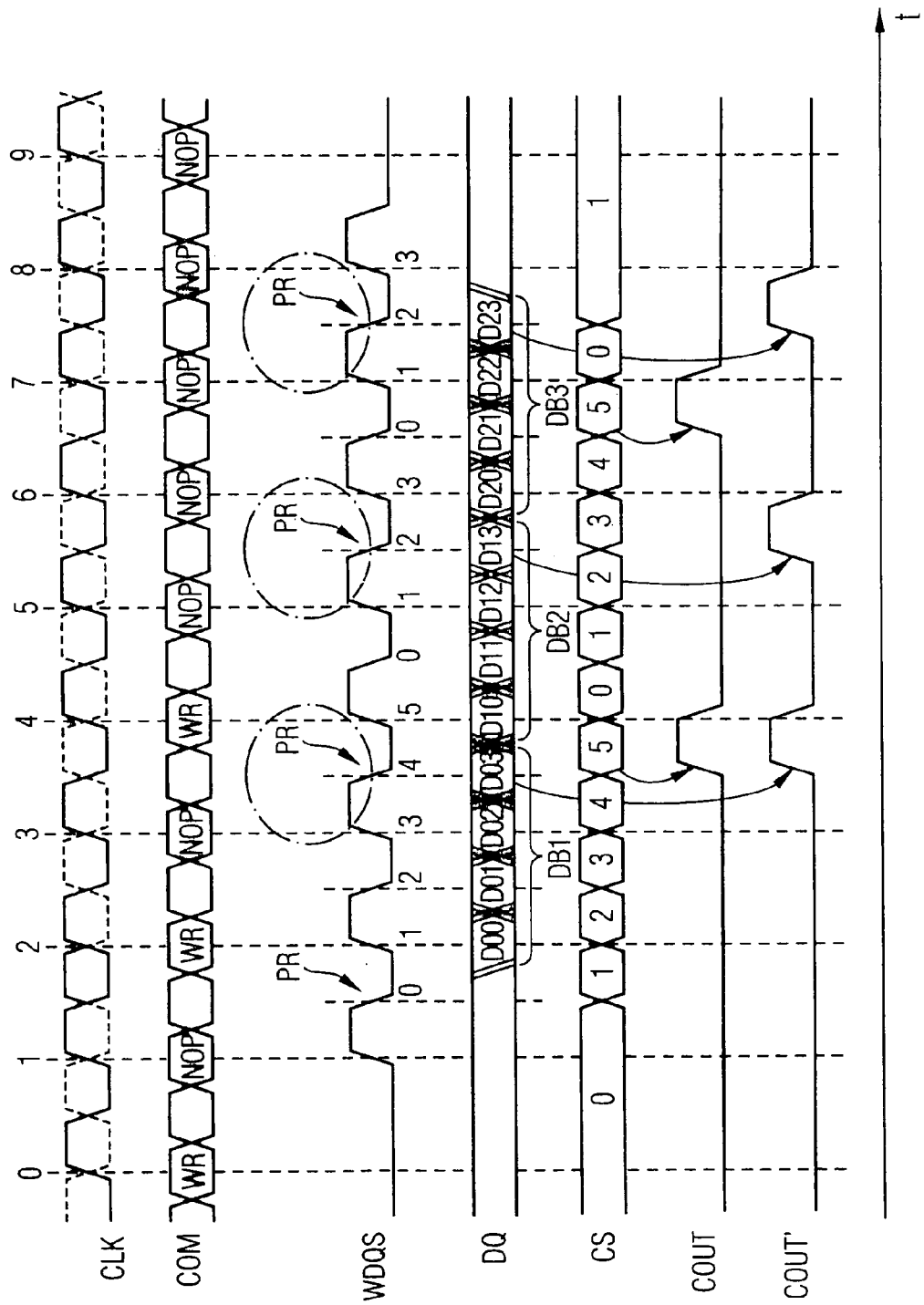
FIG. 2, as discussed above, is a flow diagram to illustrate the general problems in the case of gapless write commands.

In the figures of the drawing, elements, features and signals which are the same or have the same function have been provided—unless stated otherwise—with the same reference symbols. The exemplary embodiments are described below with reference to the G-DDR-III standard.

Figure 3:
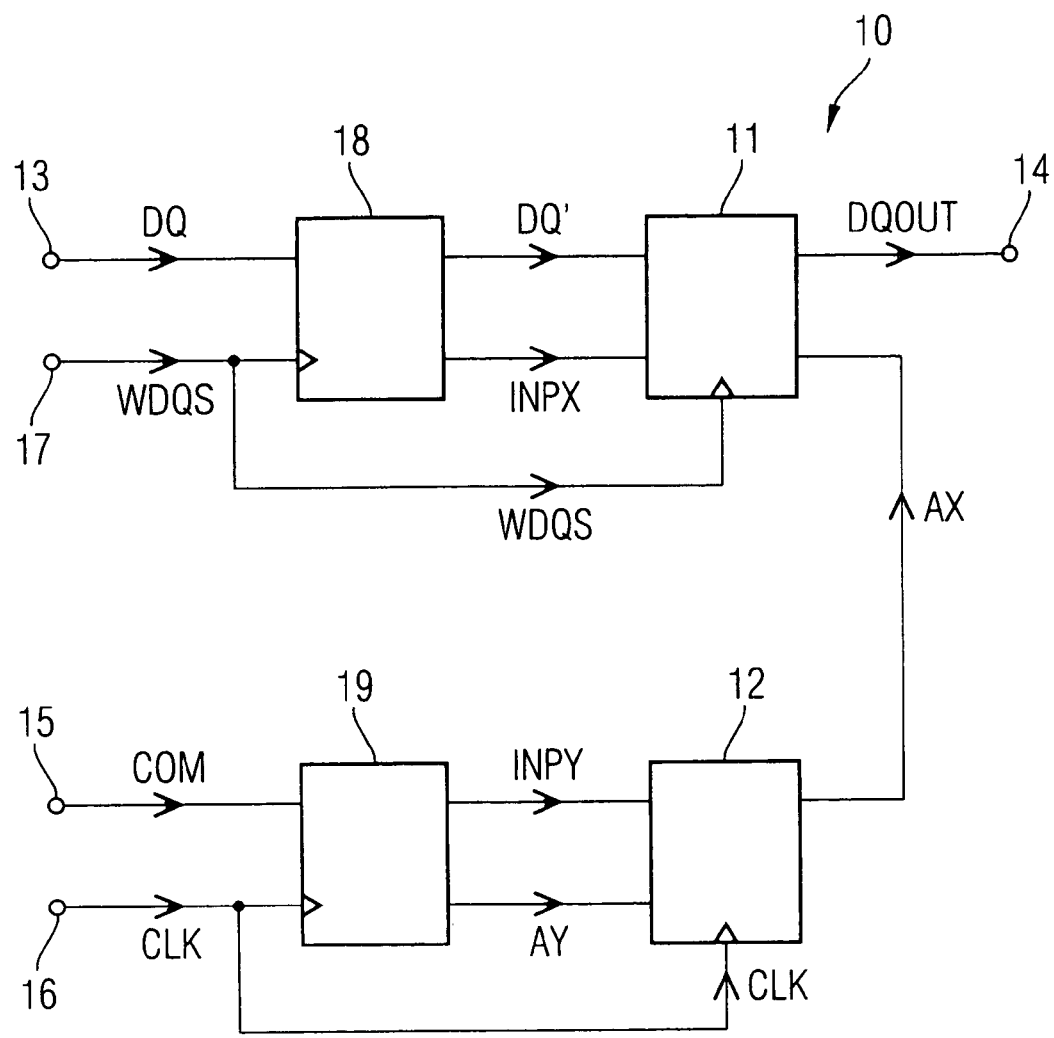
FIG. 3 is a block diagram of an inventive circuit arrangement for circumventing the preamble problems in the case of gapless write commands.

FIG. 3 shows a block diagram of an inventive circuit arrangement for circumventing the preamble problems in the case of gapless write commands. In this case, the inventive circuit arrangement is denoted by reference symbol 10. The circuit arrangement 10 is designed to distinguish a continuous, i.e. nonstop, data stream in the case of gapless write commands from an interrupted data stream in the case of gapped write commands. To 30 this end, the inventive circuit arrangement 10 has a first FIFO 11 and a second FIFO 12. The first FIFO 11 is also called a data FIFO and the second FIFO 12 is called an address FIFO below.

The circuit arrangement 10 has a data input 13 for inputting the data signals DQ and a data output 14 for tapping off the data signals DQOUT. The data signals DQ, DQOUT are available in burst form, with a data burst respectively containing a data packet having a respective plurality of single data bits. The data signals DQ contain the write data. The circuit arrangement 10 has a command input 15 for inputting encoded write commands COM. In addition, two clock inputs 16, 17 are provided, the clock input 16 being used for inputting an internal clock signal CLK. This internal clock signal CLK can be generated by a respective semiconductor memory itself, for example, or can be derived using an externally generated clock signal, for example using a DLL circuit. The second clock input 17 can have the data strobe write clock signal WDQS input into it. The internal clock signal CLK and the write clock signal WDQS are typically out of sync with one another.

The circuit arrangement 10 has two control circuits 18, 19. The first control circuit 18 is arranged between the data input 13 and the clock input 17 and the inputs of the data FIFO 11. The second control circuit 18 is arranged between the command input 15 and the clock input 16 and the inputs of the address FIFO 12. The first control circuit 18 takes the data signal DQ and produces the data-synchronous data signal DQ', which is supplied to the data FIFO 11. In addition, it takes the write clock signal WDQS and produces an input pointer INPX which is used to actuate the input of the individual cells of the data FIFO 11. The second control circuit 19 takes the write command COM and the internal clock signal CLK and produces an address AY for storage in the address FIFO 12 and also an input pointer INPY for actuating the input of the address FIFO 12. The output of the address FIFO 12 provides a start address AX, which is supplied to the data FIFO 11 and which signals to the data FIFO 11 the location in the data FIFO 11 at which valid data are stored, in order to supply them as output data DQOUT to the data output 14. The start address AX forms the output pointer AX for the respective correct cell in the data FIFO 11.

The text below gives a detailed description of the design and manner of operation of the inventive circuit 10 and particularly its control circuits 18, 19 with reference to the subsequent FIGS. 4-10.

Figure 4:
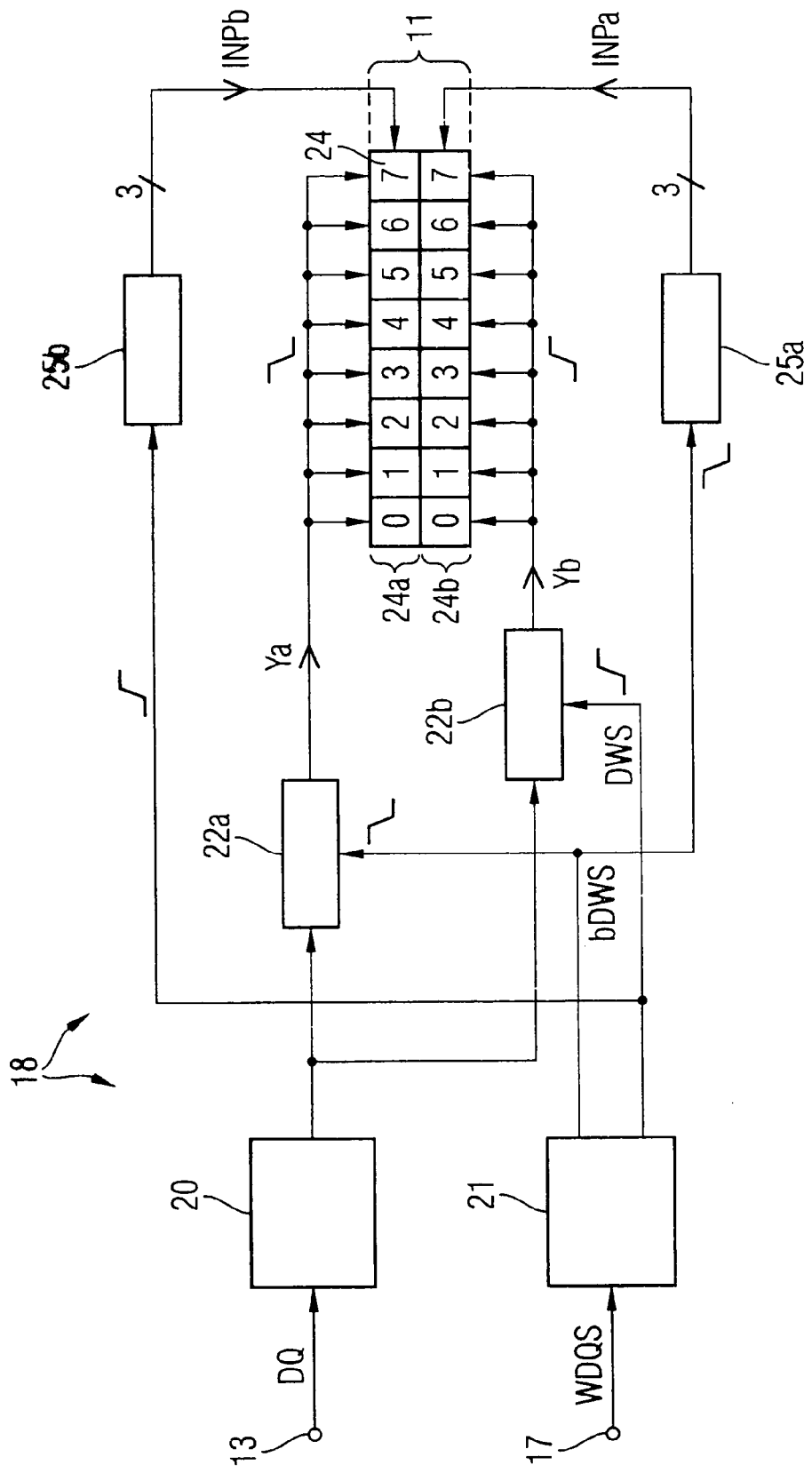
FIG. 4 is a block diagram of an exemplary embodiment of the data FIFO and of the first control circuit.

FIG. 4 shows a refinement of the data FIFO 11 and of the first control circuit 18 in detail. The first control circuit 18 contains two receiver circuits 20, 21 whose two buffer circuits 22a, 22b have input/output latches 22a, 22b connected downstream of them, for example. The first receiver circuit 20 is used to pick up the data signal DQ, which is then supplied to both buffer circuits 22a, 22b. The second receiver circuit 21 is used to produce two mutually inverted clock signals DWS, bDWS from the write clock signal WDQS. In addition, two counters 25a, 25b are provided which respectively alter their counter reading, for example by means of incrementation, upon a falling and a rising edge of the write clock signal WDQS. The counter readings of these counters 25a, 25b form the input pointers INPa, INPb for actuating the FIFO cell halves 24a, 24b.

The data FIFO 11 has two FIFO cell halves 24a, 24b in this case with a respective identical number of FIFO cells 24, so as therefore to be able to write respective data Ya, Yb to the data FIFO 11 both upon the rising edge and upon the falling edge of the write clock signal WDQS. In this case, one FIFO cell half 24a is respectively data-synchronous with the falling edge of the write clock signal WDQS, whereas the second FIFO cell half 24b is data-synchronous with the rising edge of the write clock signal WDQS. The data DQ to be written to the data FIFO 11 are clocked upon a falling edge in the case of the buffer circuit 22a and are clocked upon a rising edge of the write clock signal WDQS in the case of the buffer circuit 22b. In FIG. 4, those elements which are associated with the first and the second FIFO cell half 24a, 24b are respectively identified by an "a" or a "b" in the respective reference symbol.

The write data DQ are synchronized to the internal clock signals DWS, bDWS derived from the write clock signal WDQS using the receiver circuit 20 in the two buffer circuits 22a, 22b, in order to tune the setup and hold times for reading the data DQ into the individual FIFO cells 24 to one another. The write data DQ are then stored in FIFO cell halves 24a, 24b of the data FIFO 11, which are operated in parallel with one another, separately according to the synchronously rising and the synchronously falling edge of the write clock signal WDQS.

FIG. 5 uses a signal timing diagram to show the relevant signal profile of the data and clock signals in the circuit arrangement from FIG. 4. The first two rows show the signal profile of the received write data DQ and of the relevant internal clock signal DWS. To obtain a better overview, the inverse clock signal bDWS has not been shown here. FIG. 5 shows that at the start of the received data stream the segments of the DQ signal DQ which are denoted by 0 to 7 can be associated with a gapless write command.

Xa denotes the value of the counter 25a and Xb denotes the value of the counter 25b. Ya accordingly denotes the synchronous data for the first FIFO cell half 24a and Yb denotes the data for the second FIFO cell half 24b.

From the signal profile of the data signal DQ and of the data signal Yb in FIG. 5, it becomes clear that the data item "7" from the data signal Yb, which is intended to be stored in the cell 4 (shaded in) of the second FIFO cell half 24b in line with the counter reading Xb=4, is invalid, since it belongs to the postamble ÜP of the second data burst of the gapless write command. The same applies to the data item "b" (shaded in) from the data signal Yb, which is intended to be written to the cell 7 (shaded in) of the second FIFO cell half 24b in line with the counter reading Xb. Similarly, the data signal DQ and the data signal Ya derived therefrom can be used to derive the cells 4 and 7 of the first FIFO cell half 24a for the data in sync with the falling WDQS edge. The valid data can accordingly be found in both FIFO cell halves 24a, 24b in the cells 0, 1, 2, 3, 5, 6, 0, 1, respectively. Since the burst length is 4 in the chosen example and there is a DDR data transmission, the sequence of the valid start addresses for the individual data bursts is accordingly obtained as 0, 2, 5, 0.

Figure 6:
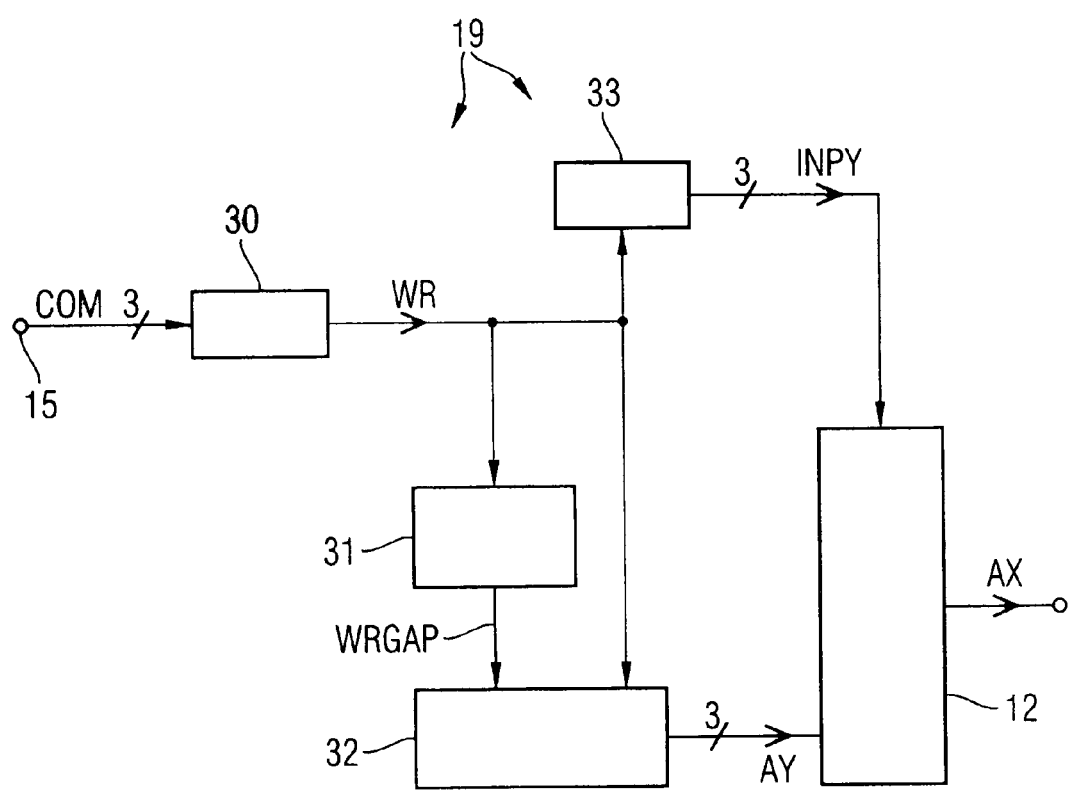
FIG. 6 is a block diagram of an exemplary embodiment of the second control circuit and of the address FIFO.

FIG. 6 shows a block diagram of a refinement of the second control circuit 19 and of the address FIFO 12. The second control circuit 19 has a command decoder 30, a gap decoder 31, an address counter 32 and a counter 33 for producing the input pointer INPY. The command decoder 30, to which the write commands COM are supplied via the input 15, decodes these commands and produces decoded write commands WR at its output, these increasing the counter 33 continually in clocked fashion via the internal clock signal CLK. The counter reading of the counter 33 then represents the value of the input counter INPY for the address FIFO. In the same way, the write commands WR are also supplied to the address counter 32 and increase its counter reading continually in clocked fashion via the internal clock signal CLK, the address counter 32 outputting the counter reading AY, which is stored in the address FIFO 12. The addresses stored in the address FIFO 12 indicate those locations in the data FIFO 11 at which valid data are stored. A signal AX which is produced accordingly by the address FIFO 12 and which acts as an output pointer from the data FIFO 11 can be used to read the data DQOUT there.

Since the data DQ can arise both as a continuous data stream and as an interrupted data stream (gapped write command), these two configurations need to be distinguished from one another so that the relevant data DQ can also continue to be handled correctly. To this end, the second control circuit 19 contains a gap decoder 31 which identifies this difference in a continuous and a discontinuous data stream. If a discontinuous data stream is present, i.e. if a gapped write command is involved, then the gap decoder 31 outputs an appropriate control signal WRGAP. Each write command WR increases the counter reading of the address counter 32 by +2, whereas the control signal WRGAP increases the counter reading of the address counter 32 additionally by +1. The control signal WRGAP thus indicates whether or not a received data stream is a discontinuous, i.e. interrupted, data stream.

The text below gives a more detailed explanation of the way in which this control circuit 19 works with reference to the flow diagram in FIG. 7. In this case, FIG. 7 refers to the example in FIG. 5, i.e. the counting sequence of the address counter 32 must provide the results 0, 2, 5, 0 in this example. The first row in the flow diagram in FIG. 7 shows the profile of the write commands WR, the second row shows the profile of the control command WRGAP and the third row shows the address signal AY.

It will be assumed that the address counter 32 is a binary 3-bit address counter 32 whose counter readings thus range from 0 to 7. At the output, the address counter 32 outputs a 3-bit address signal AY for the address FIFO 12. It will also be assumed that the address counter 32 has been initialized to 6 at first. An increase by +2 in the first step S1 (first write command) produces 0. The second write operation S2 involves a gapless write command, which means that the counter reading is increased by +2 to 2. The third write operation S3 is interrupted ("gapped"), which means that the counter is first of all increased by +1 to 3 via the control signal WRGAP and is then increased by +2 to 5 via the write command WR. The next control command WRGAP increases the counter by +1 to 6 and the fourth write operation S4 increases the counter again by +2 to 0. There follows another control command WRGAP, which means that the counter is increased by +1 to 1 and stops there. This means that the setting for the control circuit 19 and particularly its address counter 32 would already be set correctly again for a subsequent write command WR.

Figure 8:
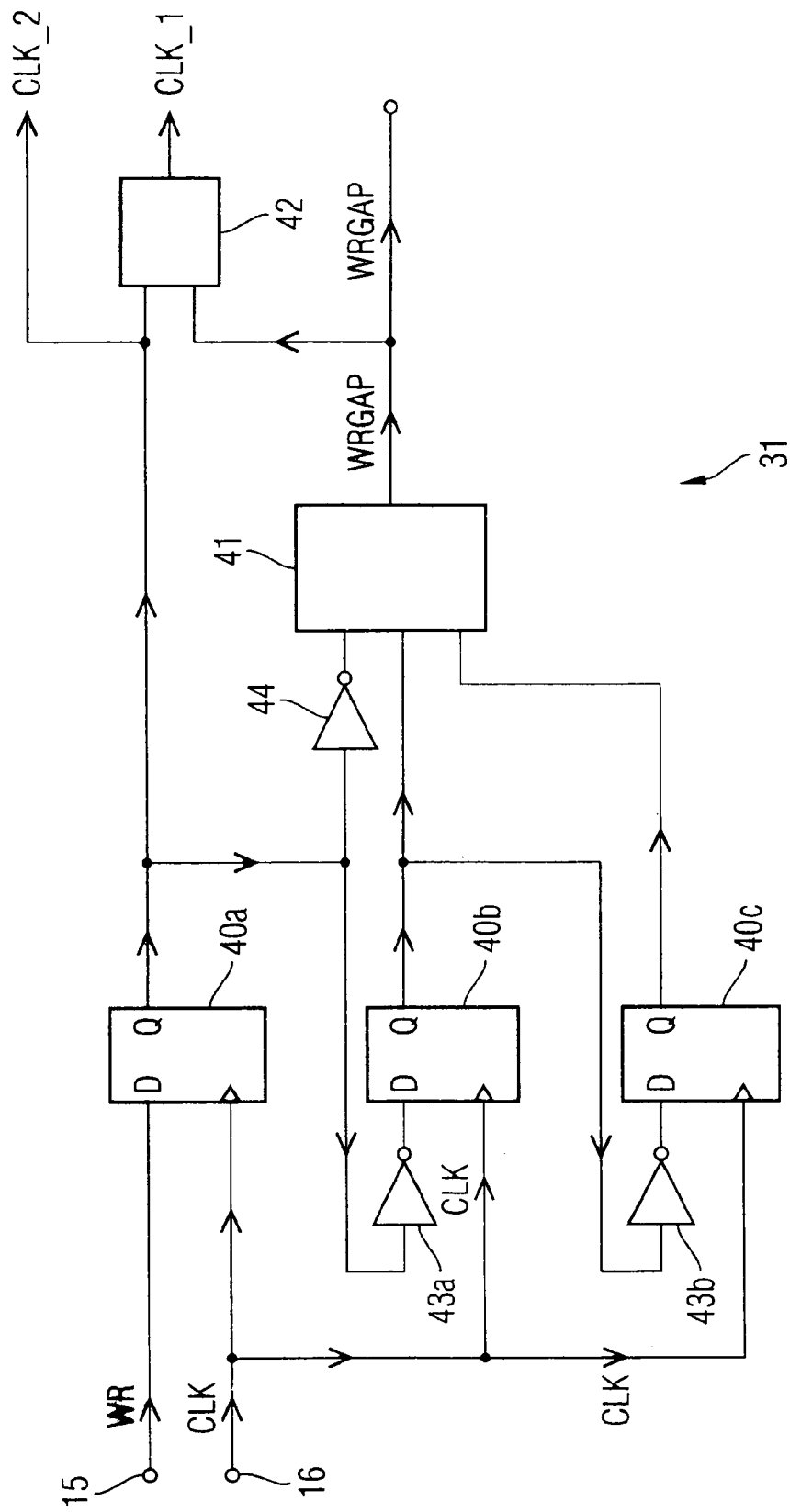
FIG. 8 is a block diagram to show a first exemplary refinement of the gap decoder in the control circuit from FIG. 6.

FIG. 8 uses a block diagram to show an exemplary refinement of the GAP decoder 31 in the control circuit 19 from FIG. 6. The output of the GAP decoder 31 produces a control signal WRGAP for actuating the start address counter 32. The GAP decoder 31 has three DQ flipflops 40a-40c, an AND gate 41 and an OR gate 42. The data input D of the first flipflop 40a is supplied with the write command WR. The Q outputs of the first two flipflops 40a, 40b are respectively connected by means of inverters 43a, 43b to the data inputs of the respective subsequent, adjacent flipflops 40b, 40c. All flipflops 40a-40c are triggered by means of the internal clock signal CLK. The AND gate 41 is supplied with the inverted output signal from the first DQ flipflop 40a and with the two output signals from the other two DQ flipflops 40b, 40c. The AND gate 41 therefore produces the control signal WRGAP. This control signal WRGAP is supplied together with the output signal from the first DQ flipflop 40a to the OR gate 42, whose output produces a control signal CLK_1. The output signal from the first DQ flipflop 40a equally forms the control signal CLK_2. The control signal CLK_1 indicates incrementation by +1 and the control signal CLK_2 indicates incrementation by +2. The control signal CLK_1 is therefore triggered by any write command WR which indicates no writing.

Figure 9:
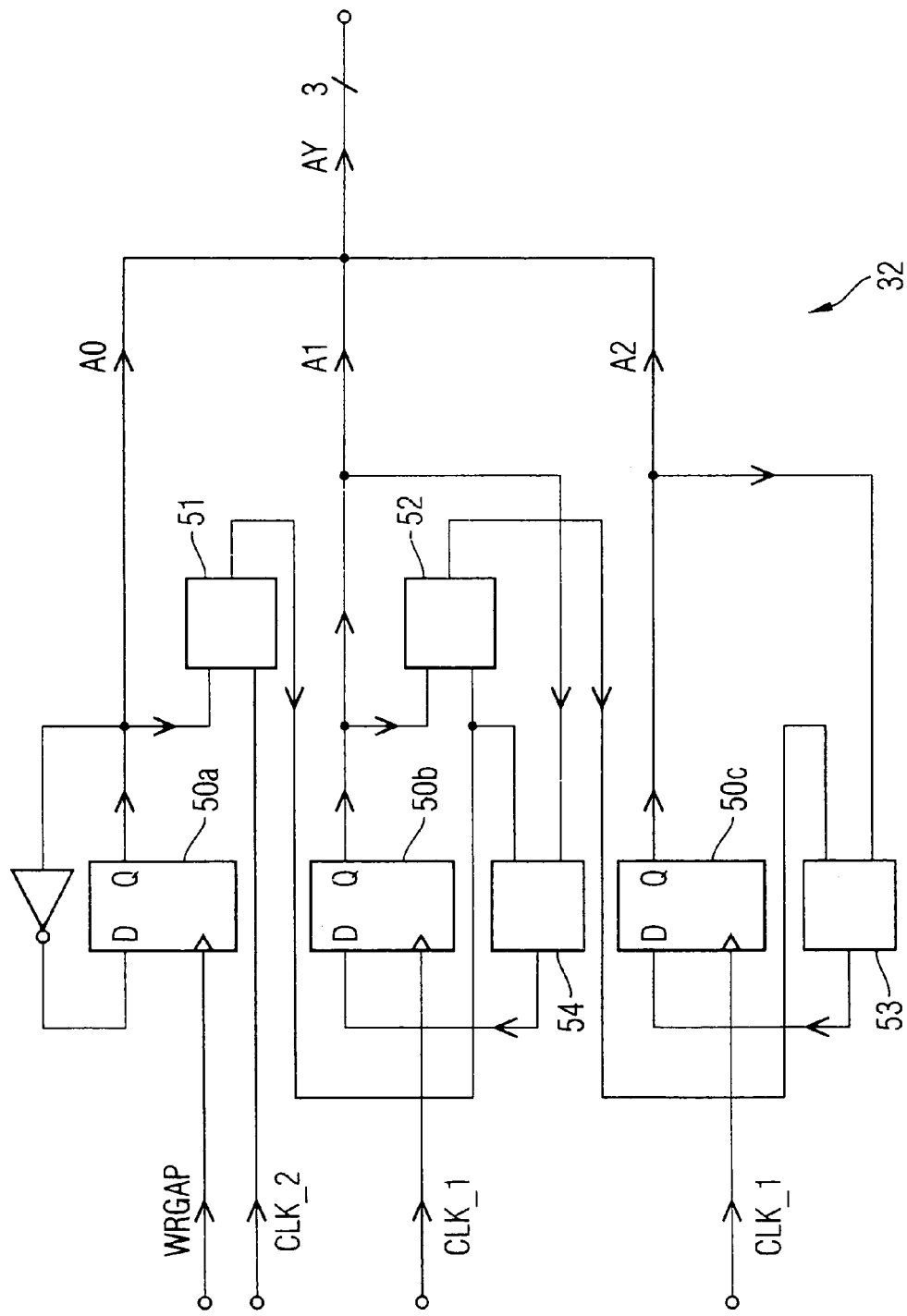
FIG. 9 is a block diagram of an exemplary refinement of the start address counter in the control circuit from FIG. 6.

FIG. 9 shows a block diagram of an exemplary refinement of the start address counter 32 in the control circuit 19 from FIG. 6. The start address counter 32 has three DQ flipflops 50a-50c, from which the first DQ flipflop 50a is triggered by the control command WRGAP and the other two DQ flipflops 50b, 50c are triggered by the control signal CLK_1, respectively. The output signal from the first flipflop is fed back to its data input via an inverter. In addition, the output signal from the first DQ flipflop 50a is input via an OR gate 51, whose input is supplied with the control signal CLK_2. The output of this OR gate 51 produces a signal which is supplied to an AND gate 52 together with the output signal from the second DQ flipflop 50b. The output signal from the AND gate 52 is supplied together with the output signal from the third DQ flipflop 50c to a NOR gate 53, whose output signal is fed back to the data input of the third DQ flipflop 50c. The output signal from the AND gate 51 is supplied together with the output signal from the second DQ flipflop 50b to a NOR gate 54 whose output signal is supplied to the data input of the second DQ flipflop 50b. The Q outputs of the three DQ flipflops 50a-50c therefore produce the address bits A0-A2 for the 3-bit address signal AY, which can be written to the address FIFO 12. FIG. 9 therefore shows an advantageous embodiment of a start address counter 32 which, depending on whether or not there is a continuous data stream, increments the counter reading by +1, as stipulated by the clock signal CLK_1, or by +2, as stipulated by the clock signal CLK_2, respectively.

Figure 10:
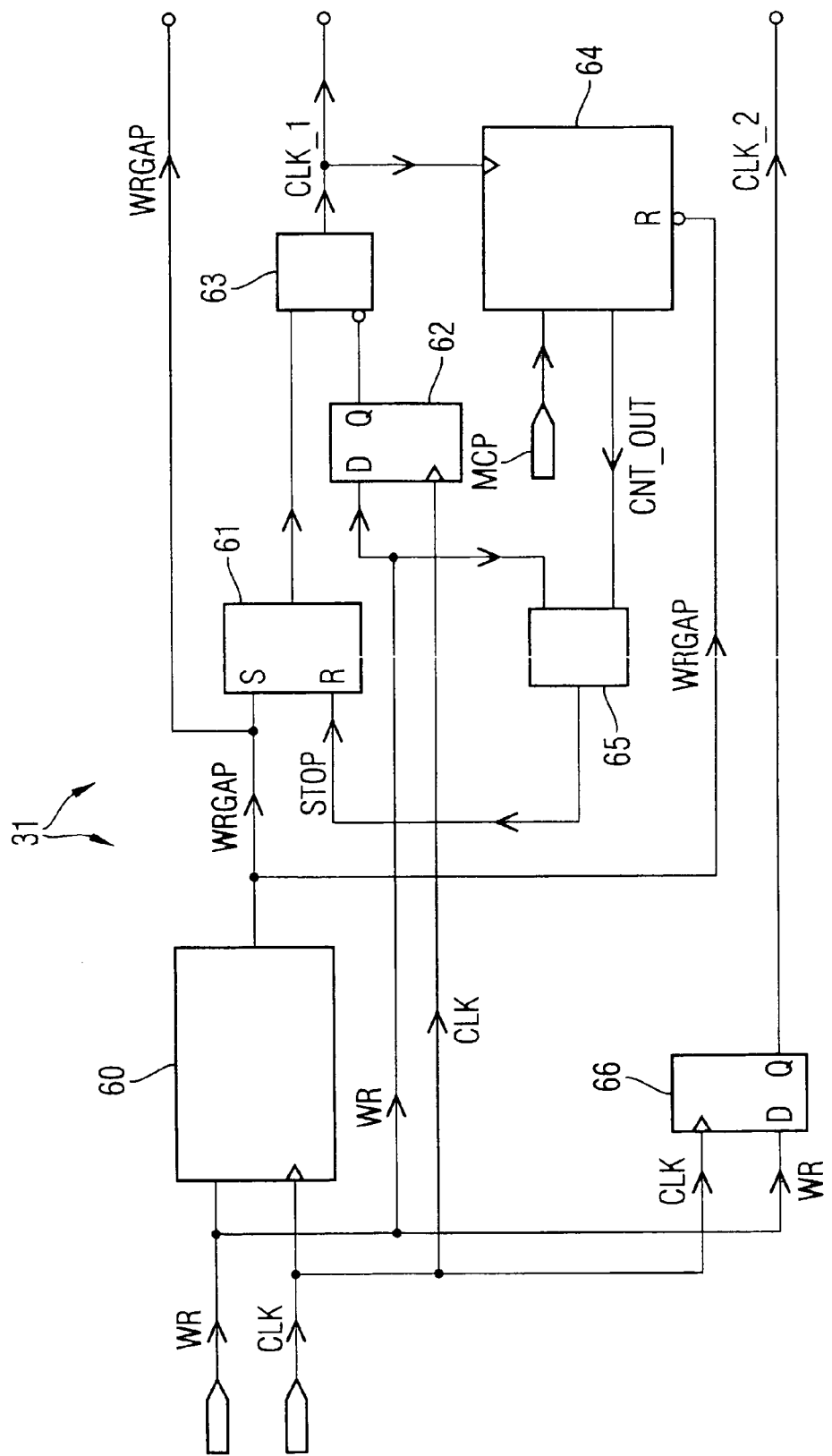
FIG. 10 is a block diagram of another exemplary embodiment of a gap decoder in the control circuit from FIG. 6.

FIG. 10 shows a block diagram of a preferred refinement of a gap decoder 31 in the control circuit 19 from FIG. 6. The gap decoder 31 contains a decoder 60 whose input is supplied with the internal clock signal CLK and with the write command WR. The decoder 60 ascertains therefrom whether the write command WR involves a continuous data stream (gapless) or an interrupted data stream (gapped). The output of the decoder 60 outputs the control signal WRGAP, which has a high logic level (HIGH, "1") in the case of an interrupted data stream (gapped) and a low logic level (LOW, "0") in the case of a continuous data stream (gapless). This control signal WRGAP can now be used to actuate the start address counter 32.

To produce the clock signals CLK_1, CLK_2, the control circuit 31 also has an RS flipflop 61. The Set input of the RS flipflop 61 has the control signal WRGAP input into it. In addition, a DQ flipflop 62 is provided whose data input D is the write signal WR input into it and whose clock input has the clock signal CLK input into it. The inverted output signal from the DQ flipflop 62 is input into an AND gate 63, whose output produces the clock signal CLK_1, together with the output signal from the RS flipflop 61.

The RS flipflop 61 also has a Reset input R into which a Reset signal STOP can be input. To produce this Reset signal STOP, a counter 64 is provided which is triggered via the clock signal CLK_1 and which can be reset via the inverted control signal WRGAP. The counter 64 ascertains a counter reading which is supplied as a counter reading signal CNT_OUT together with the write signal WR to an OR gate 65. The OR gate 65 produces the Reset signal STOP at its output.

The counter 64 also has a control input MCP which can be used to program the counter 64 for various modes of operation.

The gap decoder 31 also has a further DQ flipflop 66 whose output produces the clock signal CLK_2. To this end, the write signal WR is supplied to its data input D and the internal clock signal CLK is supplied to its clock input. Alternatively, it would also be conceivable to derive the clock signal CLK_2 directly from the Q output of the DQ flipflop 62.

The way in which the gap decoder 31 from FIG. 10 works will be described in more detail below. The address counter 32 to be actuated by means of the gap decoder 31 is increased by +2 upon every write command. This is done using the write signal WR, which is in sync with the internal clock signal CLK, and the clock signal CLK_2, which indicates incrementation by +2. The decoder 60 may be of similar design to the decoder 31 shown in FIG. 8, but without the OR gate 42 for producing the clock signal CLK_1. The control signal WRGAP produced by the output of the decoder 60 performs two functions here: firstly, it sets the RS flipflop 61. Secondly, this flipflop 61 is reset by means of the counter 64. If the flipflop 61 is not set then the counter 64 is reset. The counter 64 is implemented such that it is reset to the binary value which is prescribed by means of the control input MCP, for example. During operation, the counter 64 therefore counts back by +1 upon every clock cycle of the clock signal CLK_1. As soon as the counter reading 0 has been reached, the output signal CNT_OUT is set, said output signal using the write signal WR to generate the Reset signal STOP, which resets the RS flipflop 61 again and terminates generation of the clock signal CLK_1. For various values of the control signal MCP, the counter 64 can also be made programmable.

Although the present invention has been explained in more detail above with reference to a preferred exemplary embodiment, it is not limited thereto but rather may be modified in a wide variety of ways.

In particular, the implementation of the control circuits and of the two FIFOs has been consciously made very simple. It goes without saying that these circuit arrangements may be of any other design without departing from the fundamental principle of the present invention. In principle, it can be said that the functionality of these circuits can naturally also be implemented by a program-controlled device, for example by a microprocessor or a microcontroller, or else by a programmable logic circuit, for example a PLD or FPGA circuit.

The invention has also been described by way of example with reference to a DDR semiconductor memory which is in the form of a graphics memory. However, the invention can likewise be used for any other semiconductor memories which have a WDQS write control signal with a defined preamble and postamble. Furthermore, there does not necessarily have to be what is known as Prefetch-4 write access, in which four respective data packets are written to the memory for every data burst and hence upon every write access operation. It would also be conceivable to have other prefetch write access operations in which fewer or else more data packets are processed per write access operation.

What is claimed is:

1. A synchronization circuit for handling and synchronizing a write operation on a semiconductor memory, in which a write operation contains a plurality of write commands, comprising:
   a controllable first FIFO clocked by a data strobe write clock control signal (WDQS signal) and storing write data on the basis of one or more successive write commands;
   a controllable second FIFO clocked by an internal clock signal and storing, for a write operation, only addresses associated with valid write data of said write data stored in said first FIFO; and
   a first control circuit for controlling said first FIFO; said first control circuit being clocked by said WDQS signal and utilizing said WDQS signal to generate an input pointer indicating at what location in said first FIFO said write data are to be buffer-stored.

2. The circuit of claim 1, wherein said first control circuit comprises at least one latch for latching said write data; said write data being latched under the control of said WDQS signal.

3. The circuit of claim 2, comprising:
   a first latch for latching said write data in response to a falling edge of said WDQS signal; and
   a second latch for latching said write data in response to a rising edge of said WDQS signal; the latching respectively taking place alternately in response to said falling and said rising edge.

4. The circuit of claim 1, wherein said first control circuit comprises at least one first counter which generates a respective input pointer indicating a location at which said write data are to be written to said first FIFO.

5. The circuit of claim 1, wherein, utilizing a stored start address in said second FIFO, said second FIFO outputting an output pointer indicating a location in said first FIFO at which said valid write data are stored.

6. The circuit of claim 1, wherein, when two not directly successive write commands are present, resulting in an interrupted data stream, all of said write data stored in said first FIFO are valid.

7. The circuit of claim 1, wherein, when two directly successive write commands are present, resulting in a continuous data stream, a portion of said write data stored in said first FIFO is not valid.

8. The circuit of claim 1, wherein said WDQS signal comprises a pre-defined first logic level when being in an inactive state and wherein said WDQS signal changes from a pre-defined second logic level to said first logic level at the start of said write operation.

9. The circuit of claim 1, wherein said semiconductor memory is a DDR graphic memory.

10. A synchronization circuit for handling and synchronizing a write operation on a semiconductor memory, in which a write operation contains a plurality of write commands, comprising:
    a controllable first FIFO clocked by a data strobe write clock control signal (WDQS signal) and storing write data on the basis of one or more successive write commands;
    a controllable second FIFO clocked by an internal clock signal and storing, for a write operation, only addresses associated with valid write data of said write data stored in said first FIFO; and
    said first FIFO comprises a plurality of FIFO cells; wherein a first half of said FIFO cells are provided for storing said write data latched in response to a falling edge of said WDQS signal and a second half of said FIFO cells are provided for storing said write data latched in response to a rising edge of said WDQS signal.

11. The circuit of claim 10, wherein said semiconductor memory is a DDR graphic memory.

12. A synchronization circuit for handling and synchronizing a write operation on a semiconductor memory, in which a write operation contains a plurality of write commands, comprising:
    a controllable first FIFO clocked by a data strobe write clock control signal (WDQS signal) and storing write data on the basis of one or more successive write commands;
    a controllable second FIFO clocked by an internal clock signal and storing, for a write operation, only addresses associated with valid write data of said write data stored in said first FIFO; and
    a control circuit for controlling said second FIFO; said control circuit being clocked by said internal clock signal and utilizing said internal clock signal and said write commands to generate an output pointer for said first FIFO; said output pointer indicating at what location in said first FIFO said valid write data are to be stored.

13. The circuit of claim 12, wherein said control circuit comprises a decoder which utilizes said write command and a duration of at least two successive of said write commands to derive a control signal indicating whether a continuous or an interrupted data stream is present on the basis of two successive of said write commands.

14. The circuit of claim 12, wherein said control circuit comprises an address counter, whose counter reading
    is incremented by a first value upon each of said write commands,
    is incremented by a second value in the presence of two directly successive write commands of said write commands, and
    is reset to a start value at the end of a relevant write command of said write commands when a final value of said address counter is reached.

15. The circuit of claim 14, wherein said first value is two and the second value is one.

16. The circuit of claim 14, wherein said control circuit comprises a second counter which, for each of said write commands, generates an input pointer indicating a location in said second FIFO at which a start address generated from said counter reading of said address counter is to be stored.

17. The circuit of claim 12, wherein said semiconductor memory is a DDR graphic memory.

* * * * *